United States Patent
Miyamoto et al.

(10) Patent No.: US 7,084,590 B2
(45) Date of Patent: Aug. 1, 2006

(54) BOOSTER AND MOTOR CONTROLLER

(75) Inventors: Noboru Miyamoto, Tokyo (JP); Takeshi Oumaru, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/852,206

(22) Filed: May 25, 2004

(65) Prior Publication Data
US 2005/0146295 A1 Jul. 7, 2005

(30) Foreign Application Priority Data
Jan. 7, 2004 (JP) ............... 2004-001681

(51) Int. Cl.
*H02P 1/00* (2006.01)
*H02P 5/34* (2006.01)

(52) U.S. Cl. ............ 318/254; 318/245; 318/599; 318/801

(58) Field of Classification Search ......... 318/245, 318/254, 599, 801
See application file for complete search history.

(56) References Cited

U.S. PATENT DOCUMENTS

| | | | | |
|---|---|---|---|---|
| 2,468,546 A | * | 4/1949 | Crever | 322/18 |
| 2,841,752 A | * | 7/1958 | Denis | 318/145 |
| 3,002,143 A | * | 9/1961 | Reuther | 322/36 |
| 3,018,408 A | * | 1/1962 | Genuit | 315/95 |
| 3,068,395 A | * | 12/1962 | Perrins | 323/260 |
| 3,109,975 A | * | 11/1963 | Jacobsen | 318/751 |
| 3,140,437 A | * | 7/1964 | Canavan | 322/75 |
| 3,184,677 A | * | 5/1965 | Jacobsen | 323/256 |
| 3,230,382 A | * | 1/1966 | Burns et al. | 307/11 |
| 3,281,649 A | * | 10/1966 | Barrett et al. | 322/25 |
| 3,913,007 A | * | 10/1975 | Gilmore | 323/257 |
| 3,984,799 A | * | 10/1976 | Fletcher et al. | 363/21.08 |
| 4,107,595 A | * | 8/1978 | Campe | 318/696 |
| 4,361,791 A | * | 11/1982 | Plunkett | 318/723 |
| 4,482,813 A | * | 11/1984 | Grand-Perret et al. | 290/40 R |
| 4,814,677 A | * | 3/1989 | Plunkett | 318/254 |
| 4,814,696 A | * | 3/1989 | Kern et al. | 324/142 |
| 4,893,067 A | * | 1/1990 | Bhagwat et al. | 388/823 |
| 4,975,819 A | * | 12/1990 | Lannuzel | 363/16 |
| 5,341,278 A | * | 8/1994 | Brooks | 363/16 |
| 5,363,028 A | * | 11/1994 | Mori | 318/599 |
| 5,375,052 A | * | 12/1994 | Heavey et al. | 363/71 |

(Continued)

FOREIGN PATENT DOCUMENTS

JP 5-184180 7/1993

(Continued)

OTHER PUBLICATIONS

"Toyota Hybrid System THS II", a website of Toyota Motor Corporation. http://www.toyota.co.jp/company/eco/ths2/kouden.html (with English translation of an extract), Abstract translation only.

*Primary Examiner*—Paul Ip
(74) *Attorney, Agent, or Firm*—Oblon, Spivak, McClelland, Maier & Neustadt, P.C.

(57) ABSTRACT

A voltage sensor (101) is connected to output terminals (P, N) of a booster. The voltage sensor (101) detects a boosted voltage, and outputs the detected voltage to a first drive controller (102). The first drive controller (102) outputs a control signal to a variable resistor (22) indicating a gate resistance obtained on the basis of the boosted voltage. The variable resistor (22) is controlled to have the specified gate resistance in response to the received control signal.

18 Claims, 11 Drawing Sheets

U.S. PATENT DOCUMENTS

| | | | | |
|---|---|---|---|---|
| 5,552,684 A | * | 9/1996 | Wada et al. | 318/293 |
| 5,646,513 A | * | 7/1997 | Riggio, Jr. | 323/285 |
| 5,712,774 A | * | 1/1998 | Uramoto | 363/46 |
| 5,742,142 A | * | 4/1998 | Witt | 318/599 |
| 5,798,635 A | * | 8/1998 | Hwang et al. | 323/222 |
| 5,883,505 A | * | 3/1999 | Magazzu' et al. | 323/282 |
| 5,894,243 A | * | 4/1999 | Hwang | 327/540 |
| 6,007,160 A | * | 12/1999 | Lubbers et al. | 303/114.1 |
| 6,100,642 A | * | 8/2000 | Kim | 315/205 |
| 6,285,235 B1 | * | 9/2001 | Ichikawa et al. | 327/374 |
| 6,316,921 B1 | * | 11/2001 | Noguchi et al. | 323/222 |
| 6,583,609 B1 | * | 6/2003 | Pardoen | 323/283 |
| 6,611,127 B1 | * | 8/2003 | Arimitsu et al. | 318/801 |
| 6,677,738 B1 | * | 1/2004 | Hesse | 323/284 |
| 6,801,019 B1 | * | 10/2004 | Haydock et al. | 322/17 |

FOREIGN PATENT DOCUMENTS

| | | |
|---|---|---|
| JP | 7-76280 | 3/1995 |
| JP | 2002-112408 | 4/2002 |

\* cited by examiner

F I G . 3
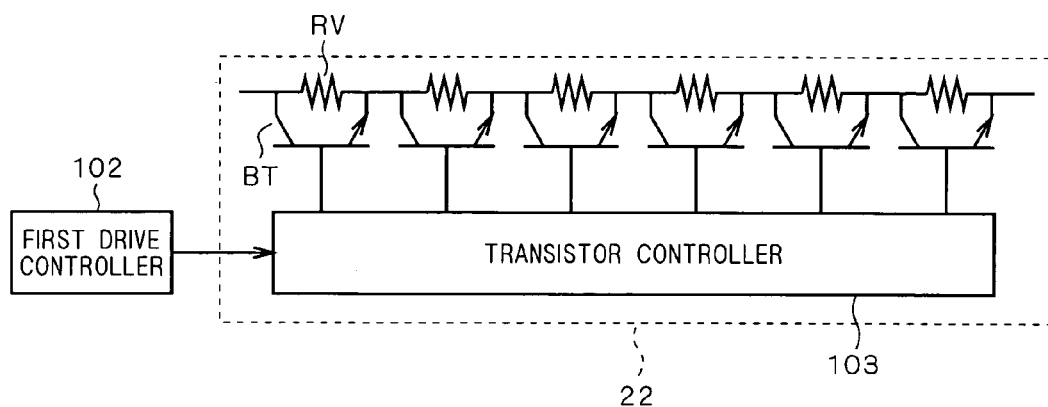
F I G . 4 A
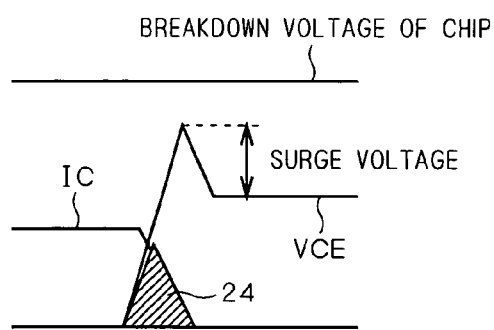
F I G . 4 B
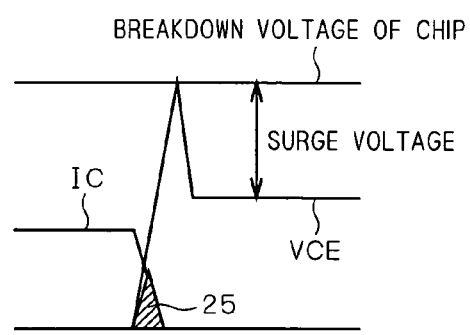

500

BOOSTER AND MOTOR CONTROLLER

BACKGROUND OF THE INVENTION

1. Field of the Invention

The present invention relates to a booster including a switching element, and more particularly, relates to a technique for reducing switching loss.

2. Description of the Background Art

Hybrid cars enhance fuel economy and exhaust emission characteristic by means of a combination of an engine and a motor as drive sources. For better fuel economy, for example, technology development has been underway to enhance drive efficiency of a motor. By way of example, a motor with a power supply voltage that is increased by a booster can be driven at a lower current than a motor providing the same output. A motor driven at a low current provides less resistance loss, leading to enhanced drive efficiency of a motor, an exemplary technique of which is introduced in example of such a technique is introduced in "TOYOTA Hybrid System THS II", <http://www.toyota.co.jp/company/eco/ths2/kouden.html> (Accessed 6 Oct. 2003), a website of TOYOTA Motor Corporation.

Rise in a boosted voltage causes current reduction in a motor, leading to still less resistance loss which further enhances drive efficiency. On the other hand, a booster and an inverter each normally include a switching element. That is, rise in a boosted voltage results in increase of losses such as steady-state loss. In response, a boosted voltage is controlled to be at a level that allows optimization of drive efficiency and losses.

Incidentally, a surge voltage is developed when a switching element is actuated. Such a surge voltage is superimposed on a boosted voltage, and the resultant voltage is applied across the collector and the emitter of the switching element in the off state. In view of this, the sum of the surge and boosted voltages should not be more than a breakdown voltage of the switching element to avoid breakage of the switching element.

Other documents relevant to the present invention are as follows:

Japanese Patent Application Laid-Open No. 07-076280 (1995)

Japanese Patent Application Laid-Open No. 2002-112408

Japanese Patent Application Laid-Open No. 05-184180 (1993)

As discussed, a boosted voltage is controlled taking drive efficiency and losses of a motor into consideration, which means the allowable range of a surge voltage changes according to the level of the boosted voltage. Increase in switching speed of a switching element within the allowable range of a surge voltage in response to the level of the boosted voltage results in reduction in switching loss. However, the booster in the background art has a fixed switching speed relative to the maximum level of the boosted voltage. A hybrid car equipped with such a booster suffers heavy losses, thus resulting in poor fuel economy, for example.

SUMMARY OF THE INVENTION

It is therefore an object of the present invention to provide a technique which realizes optimization of the switching speed of a switching element in response to a boosted voltage, to thereby reduce switching loss.

The present invention is intended for a booster for raising a power supply voltage to output a boosted voltage by means of drive of a switching element. The booster includes a voltage sensor and a driver. The voltage sensor detects the boosted voltage. The driver drives a gate of the switching element. The driver includes a switching speed controller for controlling a switching speed of the switching element in response to the output of the voltage sensor.

In the booster according to the present invention, a switching speed of the switching element is controlled in response to the boosted voltage. As a result, the booster of the present invention is allowed to have less switching loss than a booster having a fixed switching speed relative to the maximum level of a boosted voltage.

These and other objects, features, aspects and advantages of the present invention will become more apparent from the following detailed description of the present invention when taken in conjunction with the accompanying drawings.

BRIEF DESCRIPTION OF THE DRAWINGS

FIG. 3 shows the configuration of a variable resistor according to the first preferred embodiment;

FIGS. 4A and 4B each show a surge voltage and a collector current in a turn-off period in the first preferred embodiment;

DESCRIPTION OF THE PREFERRED EMBODIMENTS

First Preferred Embodiment

Figure 1:
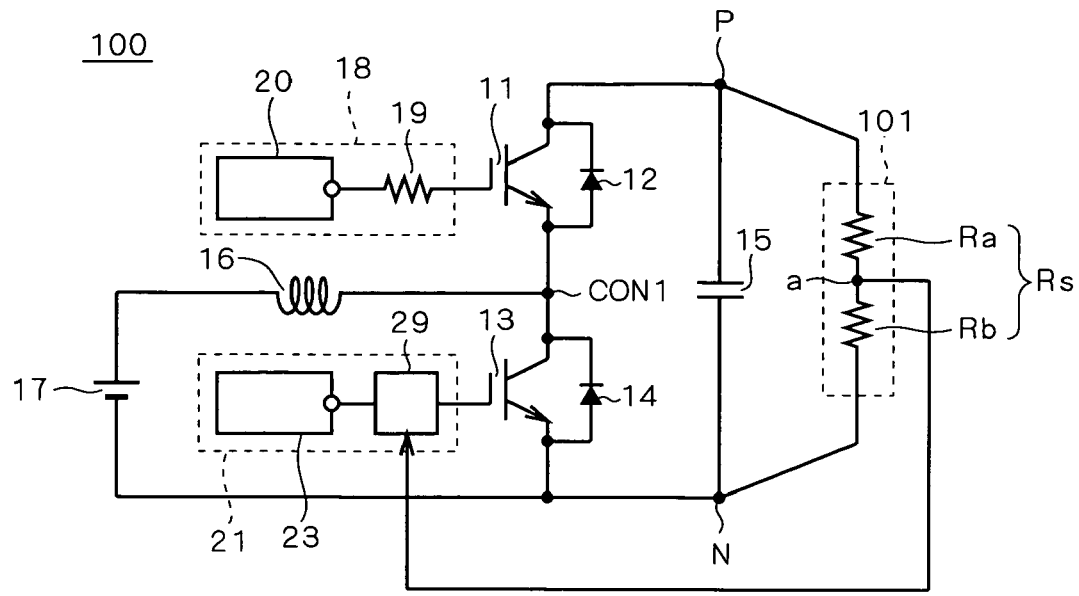
FIGS. 1 and 2 are circuit diagrams both showing the configuration of a booster according to a first preferred embodiment of the present invention.
Figure 2:
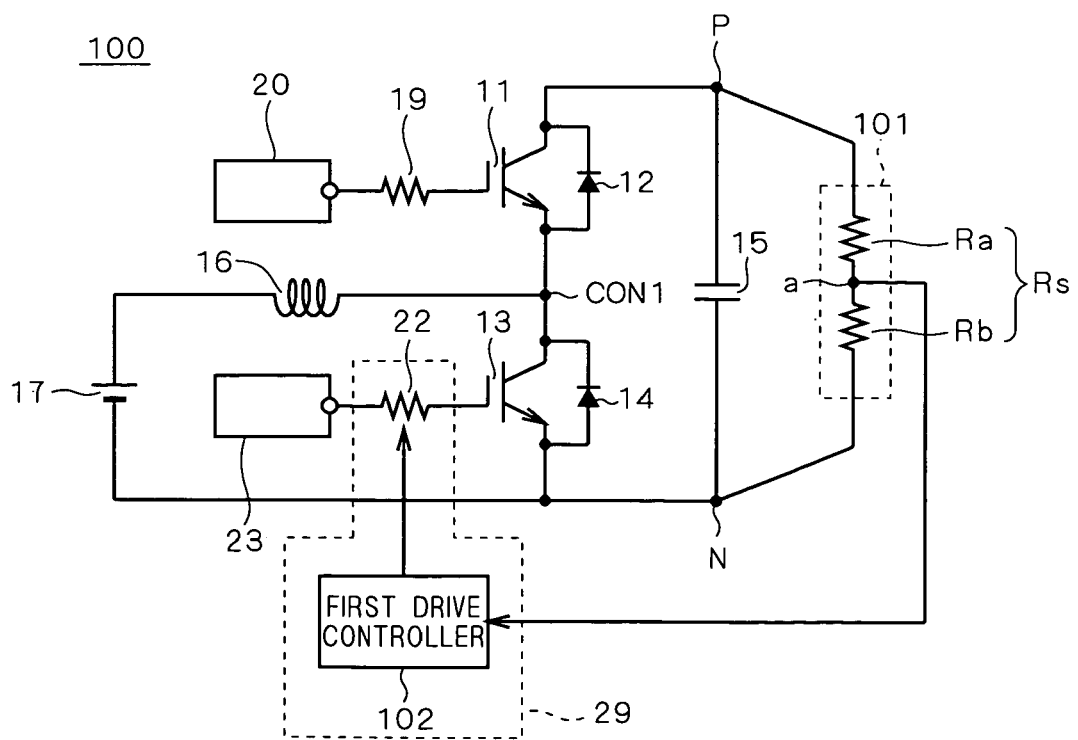

FIGS. 1 and 2 both show the configuration of a booster 100 according to a first preferred embodiment of the present invention. The booster 100 comprises IGBTs (insulated gate bipolar transistors) as switching elements. An IGBT 11 has a collector connected to the cathode of a free wheeling diode 12. The collector of the IGBT 11 is further connected at an output terminal P to one end of a capacitor 15. The IGBT 11 has an emitter connected to the anode of the free wheeling diode 12. The emitter of the IGBT 11 is further connected at a node CON1 to the collector of an IGBT 13. The collector of the IGBT 13 (first switching element) is further connected to the cathode of a free wheeling diode 14. The IGBT 13 has an emitter connected to the anode of the free wheeling diode 14. The emitter of the IGBT 13 is further connected at an output terminal N to another end of the capacitor 15. An inductance 16 has one end connected at the node CON1 to the emitter of the IGBT 11 and to the collector of the IGBT 13. The inductance 16 has another end connected to a positive output terminal of a power supply 17. The negative output terminal of the power supply 17 is connected to the emitter of the IGBT 13.

The IGBT 11 has a gate connected to a driver 18 for controlling the IGBT 11. The driver 18 comprises a resistor 19, and a drive circuit 20 for driving the IGBT 11. The resistor 19 has one end connected to the gate of the IGBT 11, and another end connected to the drive circuit 20 for driving the IGBT 11. The IGBT 13 has a gate connected to a driver 21 (first driver) for driving the IGBT 13. The driver 21 comprises a first switching speed controller 29 and a drive circuit 23. On receipt of the input from a voltage sensor 101 to be discussed later, the first switching speed controller 29 serves to control the switching speed of the IGBT 13. FIG. 2 shows an exemplary configuration of the first switching speed controller 29. With reference to FIG. 2, the first switching speed controller 29 comprises a first drive controller 102, and a variable resistor 22 which serves to control a current for charging the gate capacitance of the IGBT 13. The variable resistor 22 has one end connected to the gate of the IGBT 13, and another end connected to the drive circuit 23 for driving the IGBT 13. The drivers 18 and 21 are isolated from each other.

The voltage sensor 101 has one end connected to the output terminal P, and another end connected to the output terminal N. The output of the voltage sensor 101 is sent to the first drive controller 102. More specifically, the voltage sensor 101 detects a boosted voltage across the output terminals P and N, and outputs the detected voltage to the first drive controller 102. By way of example, the voltage sensor 101 comprises a detecting resistor $R_S$. The detecting resistor $R_S$ is divided into two resistors $R_a$ and $R_b$ connected in series at a point a. The voltage sensor 101 outputs a divided voltage developed at the point a to the first drive controller 102.

The output of the first drive controller 102 is sent to the variable resistor 22. The first drive controller 102 is isolated from the variable resistor 22. A photocoupler serves for signal output from the first drive controller 102 to the variable resistor 22. More specifically, the first drive controller 102 outputs a control signal to the variable resistor 22 indicating a gate resistance optimum for the divided voltage sent from the voltage sensor 101. The variable resistor 22 varies its resistance in response to the control signal from the first drive controller 102.

An example of the detailed configuration of the variable resistor 22 is given in FIG. 3 which shows the variable resistor 22 and the first drive controller 102. The variable resistor 22 includes a plurality of resistors RV connected in series. The resistors RV are connected in parallel to respective bipolar transistors BT. That is, the resistors RV are each interposed between the collector and the emitter of corresponding one of the bipolar transistors BT. The bipolar transistors BT each have a base connected to the output terminal of a transistor controller 103. On the basis of a signal received from the first drive controller 102, the transistor controller 103 outputs a signal which serves for on-off control of the bipolar transistors BT. The transistor controller 103 operative in this manner is realized by an ASIC (application specific integrated circuit), for example.

A current flowing into one end of the variable resistor 22 passes through the resistors RV when the bipolar transistors BT are in the off state, whereas in the on state of the bipolar transistors BT, it passes between the collector and the emitter of each bipolar transistor BT having a low resistance. The foregoing circuit configuration allows the resistance of the variable resistor 22 to be controlled to a desirable level in response to a signal received from the first drive controller 102.

Next, the operation of the booster 100 according to the first preferred embodiment will be discussed. The booster 100 serves to rise a power supply voltage by driving the IGBT 13 while keeping the IGBT 11 in the off state. The IGBT 13 is placed in the off state before voltage boost. Current flow starts from the power supply 17, passing through the inductance 16 and the free wheeling diode 12, then entering the capacitor 15, whereby the capacitor 15 is charged to a voltage level of the power supply 17. Next, the drive circuit 23 is put into operation to apply a voltage to the gate of the IGBT 13. The IGBT 13 is switched to the on state accordingly, whereby a current flows through a closed circuit formed by the power supply 17, the inductance 16, the IGBT 13, and the power supply 17. When the IGBT 13 is switched again to the off state, current flow starts from the power supply 17, passing through the inductance 16 and the free wheeling diode 12, then entering the capacitor 15. At this time, the inductance 16 experiences current reduction, to generate electromotive force in proportion to the rate of change in current which is superimposed on the voltage of the power supply 17. The capacitor 15 experiences voltage rise by the electromotive force generated in the inductance 16. The resultant boosted voltage is outputted from the output terminals P and N.

The booster 100 is further operative to serve as a device for voltage step-down. More specifically, while the IGBT 13 is kept in the off state, the IGBT 11 is driven to cause drop of a voltage inputted through the output terminals P and N. Next, it will be discussed how the booster 100 as a voltage step-down device comes into operation. The IGBT 11 is placed in the off state before voltage step-down. The drive circuit 20 becomes operative to switch the IGBT 11 to the on state, whereby a current flows from the IGBT 11 into the inductance 16. At this time, electromotive force in proportion to the rate of change in current is generated across the inductance 16, in a direction opposite to the current direction flowing into the inductance 16. As a result, voltage output from the terminal of the inductance 16 on the side of the power supply 17 experiences a drop from the voltage at the output terminal P by this electromotive force.

The voltage sensor 101 outputs a divided voltage of a boosted voltage to the first drive controller 102. On receipt of the divided voltage, the first drive controller 102 obtains the level of the boosted voltage, to thereby outputs a control signal to the variable resistor 22 indicating a gate resistance optimum for this boosted voltage. The variable resistor 22 is connected to the gate of the IGBT 13, and hence, is operative to serve as a gate resistor of the IGBT 13.

Next, it will be discussed how a resistance of a gate resistor optimum for a boosted voltage is obtained. A surge voltage is generated and switching loss occurs when the IGBT 13 is actuated. Such a surge voltage results from a parasitic inductance (not shown) interposed between the free wheeling diode 12 and the capacitor 15, for example. This surge voltage has a magnitude proportional to the rate of change of a current I (dI/dt) flowing through the parasitic inductance. In the on state of the IGBT 13, current flow starts from the power supply 17, passing through the inductance 16 and the IGBT 13, then returning to the power supply 17. That is, the parasitic capacitance between the free wheeling diode 12 and the capacitor 15 experiences no current flow. When the IGBT 13 makes a transition from the on state to the off state, current flow starts from the power supply 17, passing through the inductance 16, the free wheeling diode 12 and the capacitor 15 (voltage sensor 101), then returning to the power supply 17. At this time, the parasitic inductance between the free wheeling diode 12 and the capacitor 15 is subjected to flow of a current having a rate of change which depends on a turn-off time of the IGBT 13 in which the IGBT 13 makes a transition from the on state to the off state. That is, a longer turn-off time results in a lower rate of change in current, whereas a shorter turn-off time results in a higher rate of change in current.

Accordingly, the magnitude of a surge voltage depends on a turn-off time of the IGBT 13 in which the IGBT 13 makes a transition from the on state to the off state, namely, a switching speed of the IGBT 13. The surge voltage is generated in a direction opposite to the current direction flowing into the IGBT 13, namely, to be superimposed on the voltage at the capacitor 15 (boosted voltage). The sum of the boosted voltage and the surge voltage is applied as a voltage VCE between the collector and the emitter of the IGBT 13. The IGBT 13 has a switching speed which is proportionate to the product of the gate resistance of the IGBT 13, and the input capacitance of the IGBT 13 corresponding to the sum of the gate-collector capacitance and the gate-emitter capacitance. Accordingly, when the input capacitance is kept at a constant level, a lower gate resistance results in a higher switching speed, whereas a higher gate resistance results in a lower switching speed.

FIGS. 4A and 4B are plots of the collector-emitter voltage VCE and a collector current IC when the IGBT 13 makes a transition from the on state to the off state. A gate resistance is low in FIG. 4A, whereas it is high in FIG. 4B. Areas 24 and 25 each bounded by the collector-emitter voltage VCE and the collector current IC represent switching loss. With reference to FIG. 4A, a high gate resistance realizes a long turn-off time of the IGBT 13, whereby a surge voltage is kept at a low level while causing large switching loss (area 24). With reference to FIG. 4B, a low gate resistance realizes a short turn-off time of the IGBT 13, whereby a surge voltage in proportion to the rate of change in current has a large magnitude while reducing switching loss (area 25). As a result, control of a gate resistance in response to the level of a boosted voltage and increase in switching speed within the allowable range of a surge voltage realize reduction in switching loss.

Figure 5:
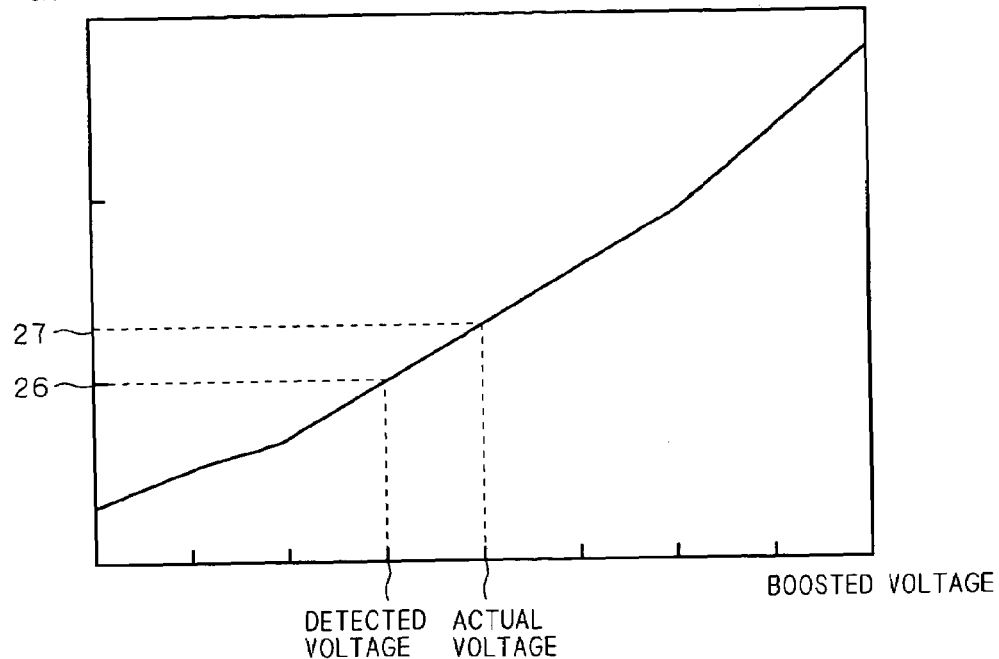
FIG. 5 shows an optimum gate resistance with respect to a boosted voltage in the first preferred embodiment.

FIG. 5 is a plot showing an optimum gate resistance (vertical axis) with respect to the level of a boosted voltage (horizontal axis). The plot of FIG. 5 is obtained by an exemplary way as follows. First, the gate resistance of the IGBT 13 is set to be relatively high to avoid breakage of the IGBT 13 as a result of a great magnitude of a surge voltage. Next, the voltage of the booster 100 is boosted to an appropriate level. Thereafter the resistance of the variable resistor 22 is gradually lowered while measuring the collector-emitter voltage VCE of the IGBT 13, to find a gate resistance at which the collector-emitter voltage VCE is approximately the same in level as a breakdown voltage between the collector and the emitter. These steps are performed on several different levels of a boosted voltage, whereby the optimum gate resistance is obtained as data. The optimum gate resistance is eventually determined considering the factors into consideration including whether a surge voltage is within the allowable range, whether there is no possibility of thermal breakdown of an IGBT as a result of heat generation caused by switching loss, whether there is no possibility of increase of radiation noise as a result of a surge voltage, and the like.

The first drive controller 102 has a microcomputer inside which stores a gate resistance optimum for a boosted voltage as data (FIG. 5). On the basis of the received divided voltage, the first drive controller 102 obtains the level of a boosted voltage, reads an optimum gate resistance according to the data shown in FIG. 5, and outputs a control signal to the variable resistor 22 indicating the optimum gate resistance. In response to the control signal sent from the first drive controller 102, the variable resistor 22 performs on-off control of the bipolar transistors BT, whereby the variable resistor 22 is controlled to have the specified resistance.

As discussed, in the booster 100 of the first preferred embodiment, the resistance of the variable resistor 22 serving as a gate resistor of the IGBT 13 is controlled in response to an actual boosted voltage. The switching speed of the IGBT 13 is controlled accordingly. The switching speed is subjected to constant change in response to an actual boosted voltage, and hence, the booster 100 is allowed to have less switching loss than a booster having a fixed switching speed relative to the maximum level of the boosted voltage.

As an exemplary alternative configuration, the resistor 19 may be a variable resistor to receive the output of the first drive controller 102. When the booster 100 serves as a device for voltage step-down, the resistance of the variable resistor 19 is adjusted to control the switching speed of the IGBT 11, whereby switching loss reduction is realized.

Second Preferred Embodiment

Figure 6:
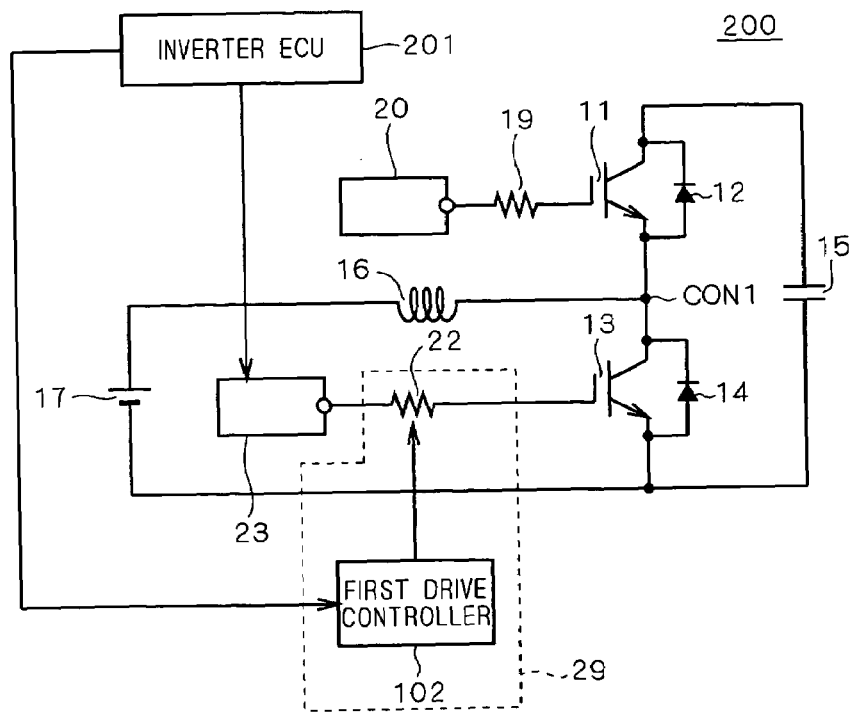
FIG. 6 is a circuit diagram showing the configuration of a booster according to a second preferred embodiment of the present invention.

FIG. 6 shows the configuration of a booster 200 according to a second preferred embodiment of the present invention. In the second preferred embodiment, the voltage sensor 101 is replaced by an inverter ECU (electronic control unit) 201 as a higher order system. The output of the inverter ECU 201 is sent to the first drive controller 102 and the drive circuit 23. Except for the inverter ECU 201, the second preferred embodiment has the same configuration as that of the first preferred embodiment. The constituent elements serving in the same manner as those of the first preferred embodiment are designated by the same reference numerals, and the detailed description thereof will be omitted.

Figure 7:
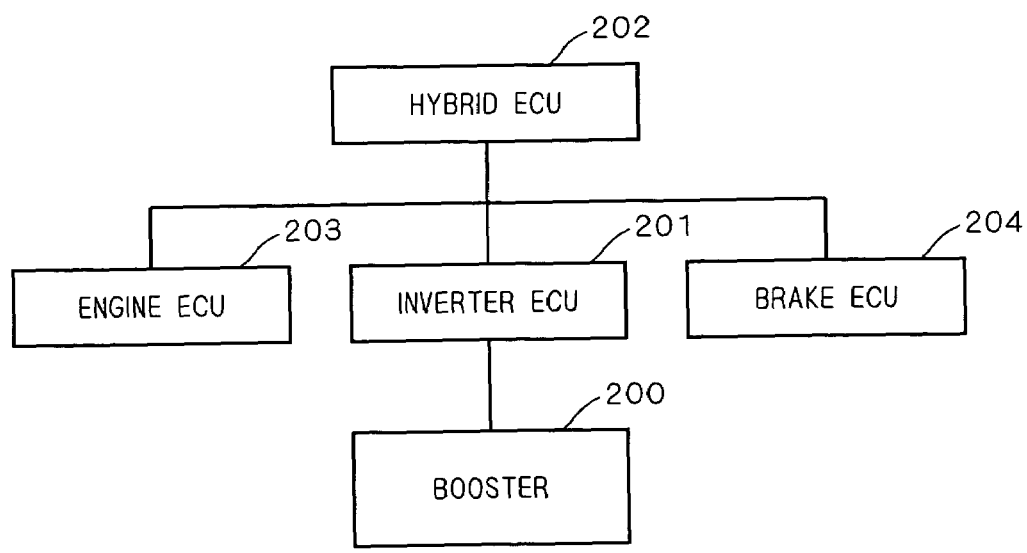
FIG. 7 is a block diagram showing the configuration of a vehicle controller according to the second preferred embodiment.

Next, the detail of the inverter ECU 201 will be discussed. FIG. 7 is a block diagram showing the configuration of a vehicle controller. The output of a hybrid ECU 202 serving for integrated control of the entire vehicle is sent to an engine ECU 203, to a brake ECU 204, and to the inverter ECU 201. The output terminal of the inverter ECU 201 is connected to the booster 200. On receipt an instruction to control motor output sent from the hybrid ECU 202, the inverter ECU 201 calculates the level of a boosted voltage that allows optimization of drive efficiency of the motor and losses caused by actuation of the booster 200, for example. The calculated value is sent as a target boosted voltage to the booster 200.

Next, the operation of the booster 200 will be discussed. The first drive controller 102 and the drive circuit 23 receive the output of the inverter ECU 201 as a high order system. The drive circuit 23 performs on-off control of the IGBT 13 in such a manner that the target boosted voltage specified by the inverter ECU 201 is realized. The first drive controller 102 reads a gate resistance optimum for the target boosted voltage specified by the inverter ECU 201 according to the data shown in FIG. 5, and outputs a control signal to the variable resistor 22 indicating the optimum gate resistance. The second preferred embodiment follows the same process to obtain an optimum gate resistance as in the first preferred embodiment, and hence, the description thereof is omitted. In response to the received control signal, the variable resistor 22 is controlled to have the optimum gate resistance.

In the second preferred embodiment, a gate resistance is optimized on the basis of the target boosted voltage outputted from the inverter ECU 201 as a high order system, to thereby control the switching speed of the IGBT 13. As a result, the booster 200 is allowed to have less switching loss than a booster having a fixed switching speed relative to the maximum level of the boosted voltage. The second preferred embodiment further advantageously eliminates the voltage sensor 101, thus realizing reduction in manufacturing cost.

Figure 8:
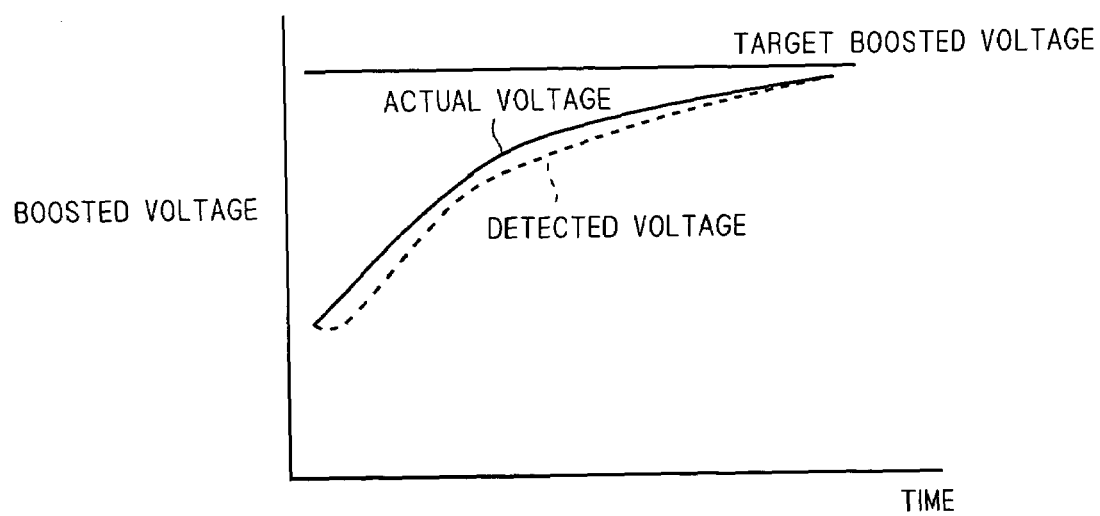
FIG. 8 shows how a boosted voltage changes over time after voltage boost is started in the second preferred embodiment.

In the first preferred embodiment, an actual boosted voltage is sent through the voltage sensor 101 to the first drive controller 102, causing delay in the output of the voltage sensor 101 from the change in boosted voltage. Such delay causes a boosted voltage sent from the voltage sensor 101 to be lower than the actual boosted voltage as shown in FIG. 8. FIG. 8 shows the level of a boosted voltage (vertical axis) with respect to time (horizontal axis) after voltage boosted is started. FIG. 8 includes a target boosted voltage, a boosted voltage actually applied (actual voltage), and a boosted voltage outputted from the voltage sensor 101 (detected voltage).

A gate resistance optimized for the detected voltage is lower than a gate resistance optimized for the actual voltage, as seen from an example shown in FIG. 5. With reference to FIG. 5, a gate resistance 26 optimized for the detected voltage at some point in time is lower than a gate resistance 27 optimized for the actual voltage at the same point in time. Hence, the switching speed of the IGBT 13 determined on the basis of the detected voltage is higher than that determined on the basis of the actual boosted voltage, thus generating a surge voltage which exceeds its actually allowable range. Such a surge voltage may cause breakage of the IGBT 13.

In response, in the second preferred embodiment, the resistance of the variable resistor 22 is controlled on the basis of the target boosted voltage received from the inverter ECU 201 as a high order system. Accordingly, a gate resistance is never set to be lower than the value optimized for the actual voltage. That is, the switching speed of the IGBT 13 is never higher than the switching speed determined on the basis of the actual voltage, whereby breakage of the IGBT 13 as a result of a surge voltage is prevented.

Third Preferred Embodiment

Figure 9:
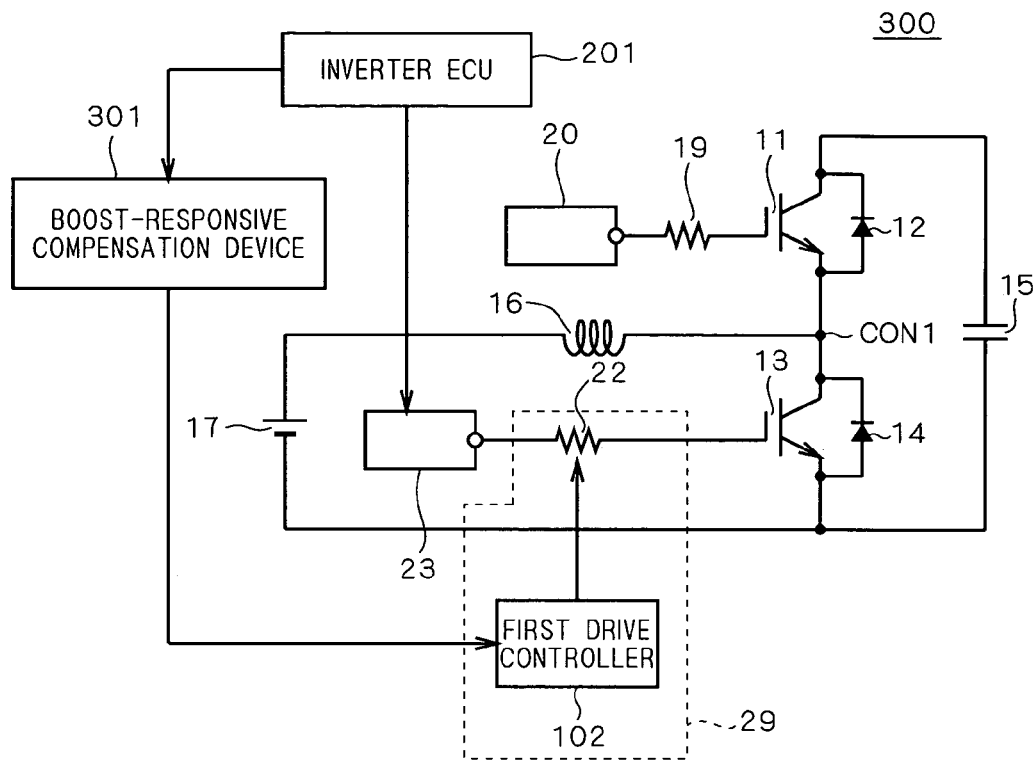
FIG. 9 is a circuit diagram showing the configuration of a booster according to a third preferred embodiment of the present invention.

FIG. 9 shows the configuration of a booster 300 according to a third preferred embodiment of the present invention. The constituent elements serving in the same manner as those of the first and second preferred embodiment are designated by the same reference numerals, and the detailed description thereof will be omitted. The output of the inverter ECU 201 as a high order system is sent to a boost-responsive compensation device 301. The output of the boost-responsive compensation device 301 is sent to the first drive controller 102. The output of the inverter ECU 201 is also sent to the drive circuit 23. The boost-responsive compensation device 301 has a microcomputer inside. On the basis of a target boosted voltage received from the inverter ECU 201, the boost-responsive compensation device 301 serves to estimate an actual boosted voltage with respect to time after voltage boosted is started. The resultant voltage (estimated voltage) is sent to the first drive controller 102.

Next, it will be discussed in detail how the estimated voltage is obtained. First, a time constant T relative to the boosted voltage is calculated. In a device producing an output which asymptotically gets closer to a predetermined set value, the time constant T is generally known to be approximately the same as a time interval required for the output to reach 63 percent of the predetermined set value. In the case of the booster 300, the time constant T is approximately the same as a time interval required for the actual boosted voltage to reach 63 percent of the target boosted voltage after voltage boost is started in the booster 300. As an exemplary way to calculate the time constant T in the booster 300, a voltage waveform of the actual boosted voltage is used that is obtained after the booster 300 is driven to cause voltage rise to the target boosted voltage of an appropriate level. The time constant T is calculated in the same manner with respect to different levels of the target boosted voltage, and the resultant values of the time constant T are approximated by interpolation. The time constant T thereby obtained is stored as data in the microcomputer of the boost-responsive compensation device 301.

Next, a first-order lag element GS is calculated using the time constant T and the target boosted voltage (hereinafter alternatively referred to as "K" in some cases). The first-order lag element GS is given by $$GS = K/(1+ST)$$

where S is a variable. The first-order lag element GS thereby obtained is subjected to inverse Laplace transform, whereby change in boosted voltage over time is estimated after voltage boost is started to obtain the estimated voltage.

The boost-responsive compensation device 301 sends the estimated voltage with respect to time thereby obtained to the first drive controller 102. The first drive controller 102 outputs a control signal to the variable resistor 22 indicating a gate resistance optimum for this estimated voltage. The third preferred embodiment follows the same process to obtain an optimum gate resistance as in the first preferred embodiment, and hence, the description thereof is omitted. In response to the received control signal, the variable resistor 22 is controlled to have the optimum gate resistance.

Figure 10:
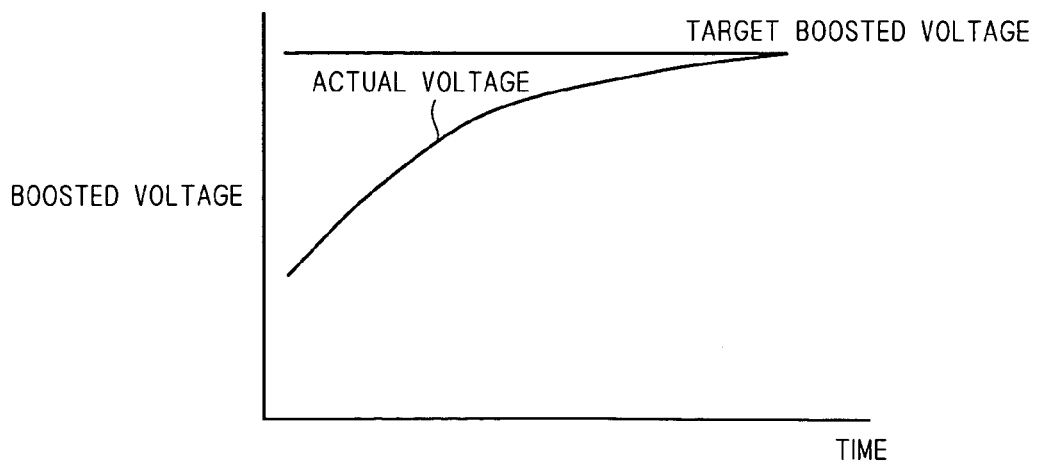
FIG. 10 shows how a boosted voltage changes over time after voltage boost is started in the third preferred embodiment.

The third preferred embodiment also eliminates the voltage sensor 101, thus preventing delay as a result of presence of the voltage sensor 101 and realizing reduction in manufacturing cost. With reference to FIG. 10, in a time period after voltage boost is started to obtain the target boosted voltage, the boosted voltage actually applied (actual voltage) is lower than the target boosted voltage. FIG. 10 shows the respective levels of the actual voltage and the target boosted voltage with respect to time after voltage boost is started (horizontal axis). Accordingly, in a time period in which voltage boost continues to obtain the target boosted voltage, the switching speed of the IGBT 13 optimized for the target boosted voltage is lower than the switching speed optimized for the actual voltage.

In response, in the third preferred embodiment, change of the actual voltage with respect to time is estimated by means of the target boosted voltage, and the resultant estimated voltage is used to control the gate resistance. Accordingly, optimization of the gate resistance is allowed even in the time period after voltage boost is started to obtain the target boosted voltage. As a result, the booster 300 is allowed to have less switching loss than a booster which controls a switching speed using only the target boosted voltage.

Fourth Preferred Embodiment

Figure 11:
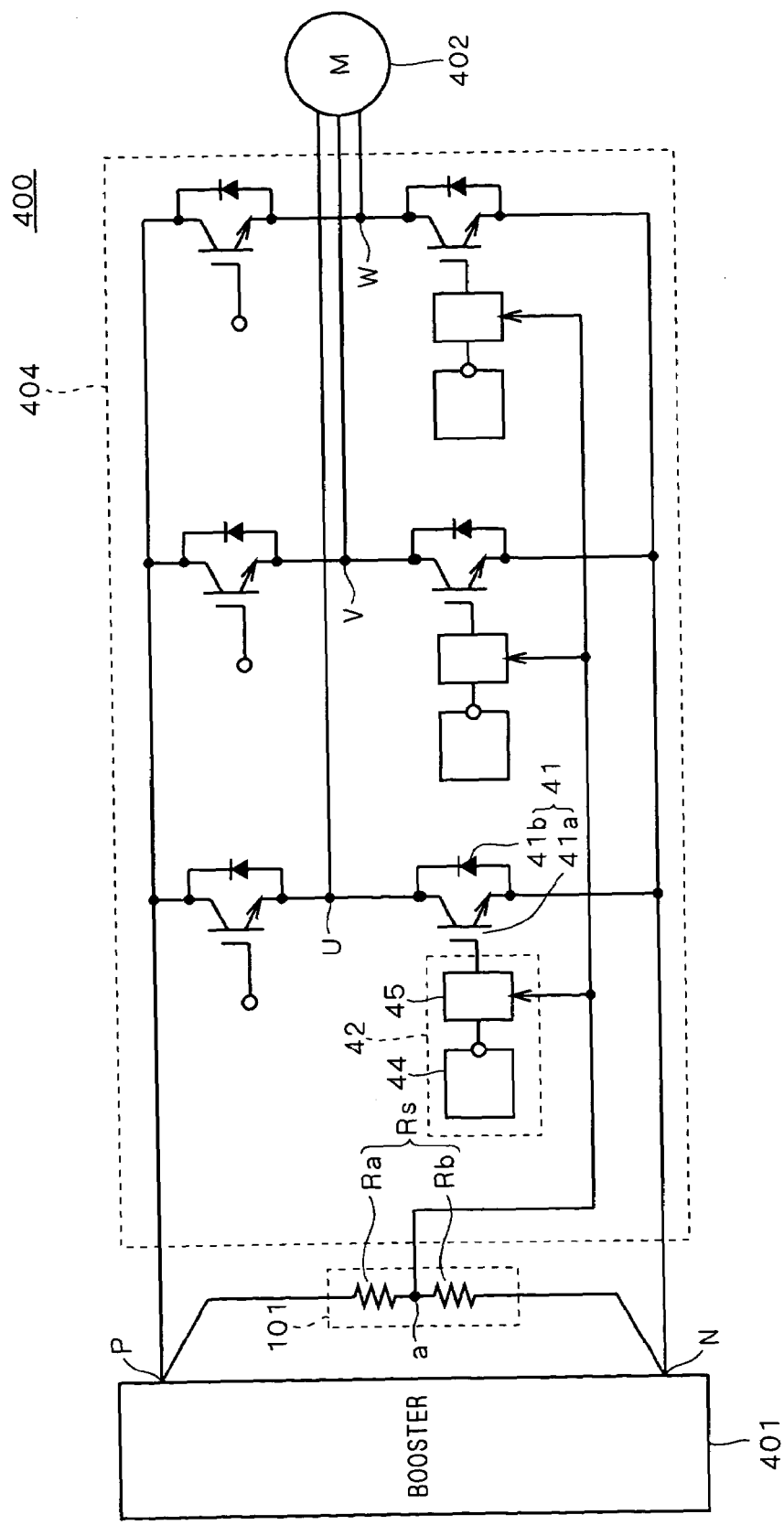
FIGS. 11 and 12 are circuit diagrams both showing a motor controller according to a fourth preferred embodiment of the present invention.
Figure 12:
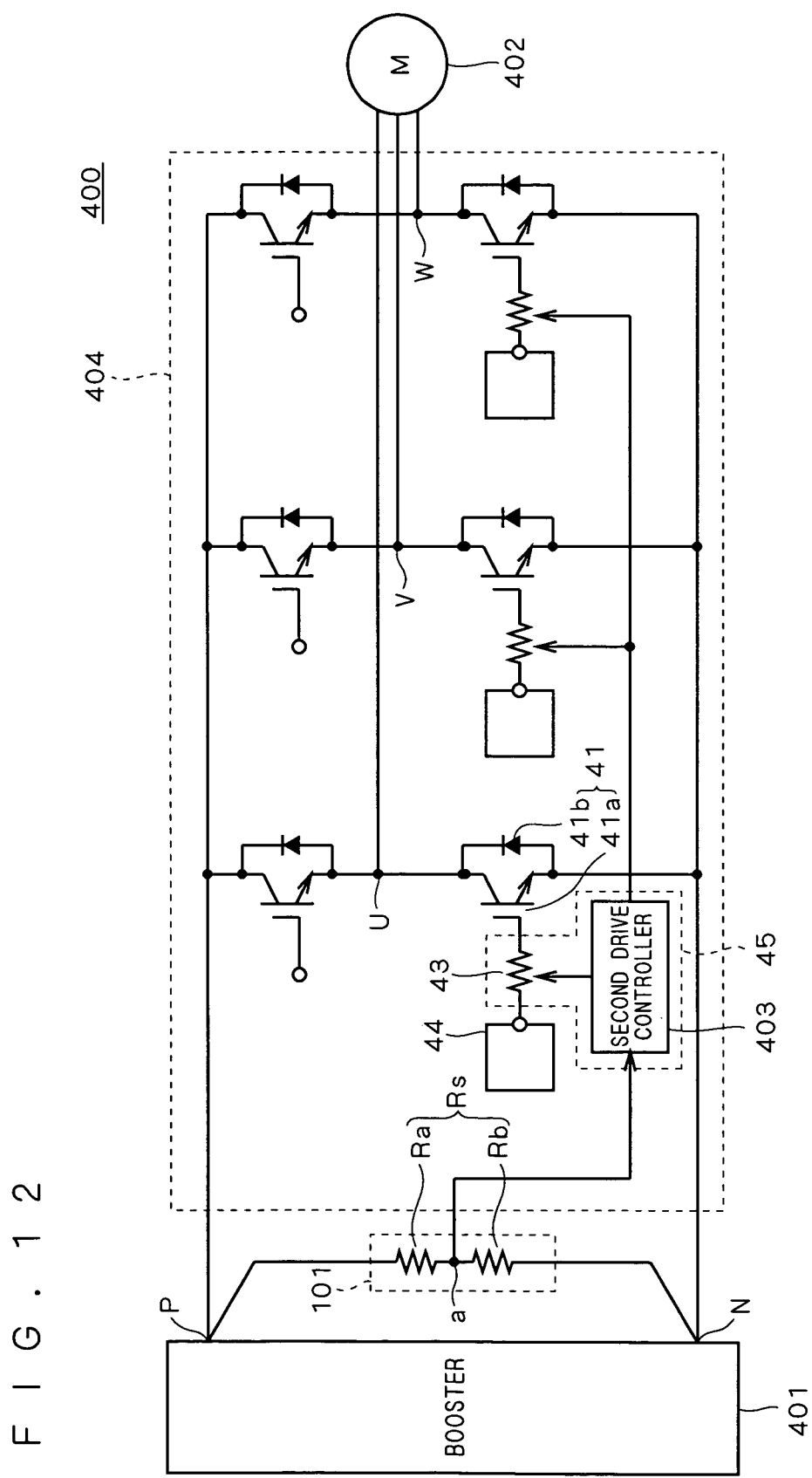

FIGS. 11 and 12 are circuit diagrams both showing the configuration of a motor controller 400 according to a fourth preferred embodiment of the present invention. As an example, a motor 402 may be a three-phase motor, and IGBTs are used as switching elements. With reference to FIG. 11, the motor controller 400 comprises a three-phase inverter 404 and a booster 401, for example. More specifically, the three-phase inverter 404 comprises series-connected semiconductor elements 41 each including an IGBT 41a (second switching element) and a diode 41b having inverse-parallel connection to the IGBT 41a. The semiconductor elements 41 connected in series together form an arm. The inverter 404 comprises three arms connected in parallel.

The IGBTs constituting the inverter 404 each have a gate connected to driver for performing on-off control of corresponding one of the IGBTs. As an example, the gate of the IGBT 41a is connected to a driver 42 (second driver) for controlling the IGBT 41a. The driver 42 performs on-off control of the IGBT 41a. The driver 42 comprises a second switching speed controller 45, and a drive circuit 44 for driving the IGBT 41a. On receipt of the input from the voltage sensor 101 discussed below, the second switching speed controller 45 serves to control the switching speed of the IGBT 41a.

FIG. 12 shows an exemplary configuration of the second switching speed controller 45. The second switching speed controller 45 comprises a variable resistor 43 having one end connected to the gate of the IGBT 41a and another end connected to the drive circuit 44, and a second drive controller 403. The variable resistor 43 has the same configuration as that of the variable resistor 22 discussed in the first preferred embodiment, and hence, the description thereof is omitted. The gates of the IGBTs are connected to respective drivers, whereas in FIGS. 11 and 12, these drivers are omitted with respect to the upper IGBTs.

Output terminals U, V and W are connected to the motor 402. The output terminals P and N are connected to the booster 401 to receive a boosted voltage. The voltage sensor 101 is connected to the booster 401 for measuring the boosted voltage. The voltage sensor 101 has the same configuration as the one discussed in the first preferred embodiment, and hence, the description thereof is omitted. The output of the voltage sensor 101 is sent to the second drive controller 403. On the basis of the output from the voltage sensor 101, the second drive controller 403 sends a control signal to the variable resistor of each driver.

Next, the operation of the motor controller 400 having the foregoing configuration will be discussed. By means of on-off control of each IGBT, the inverter 404 converts a boosted voltage into an alternating voltage, whereby the motor 402 is actuated. The voltage sensor 101 outputs a divided voltage of the boosted voltage to the second drive controller 403. On the basis of a gate resistance optimum for the boosted voltage obtained in advance (see FIG. 13 discussed below), the second drive controller 403 outputs a control signal to each variable resistor.

Next, it will be discussed how an optimum gate resistance is obtained. A surge voltage is generated and switching loss occurs when each IGBT consisting the inverter 404 is actuated. Such a surge voltage results from a parasitic inductance (not shown) provided in interconnection. This surge voltage has a magnitude proportional to the rate of change of a current flowing through the parasitic inductance. A higher rate of change in current results in a greater magnitude of a surge voltage, whereas a lower rate of change in current results in a smaller magnitude of a surge voltage. Such a rate of change in current have dependence on a turn-off time of the IGBTs in which the IGBTs make a transition from the on state to the off state. That is, a shorter turn-off time results in a higher rate of change in current, thereby generating a surge voltage of great magnitude. Conversely, a higher rate of change in current results in less switching loss, whereas a lower rate of change in current results in larger switching loss.

The turn-off time of the IGBTs is proportionate to the product of the gate resistance of the IGBTs, and the input capacitance of the IGBTs corresponding to the sum of the gate-collector capacitance and the gate-emitter capacitance. Accordingly, when the input capacitance is kept at a constant level, a lower gate resistance results in a shorter turn-off time, whereas a higher gate resistance results in a longer turn-off time. That is, a surge voltage can be controlled by control of a gate resistance.

Figure 13:
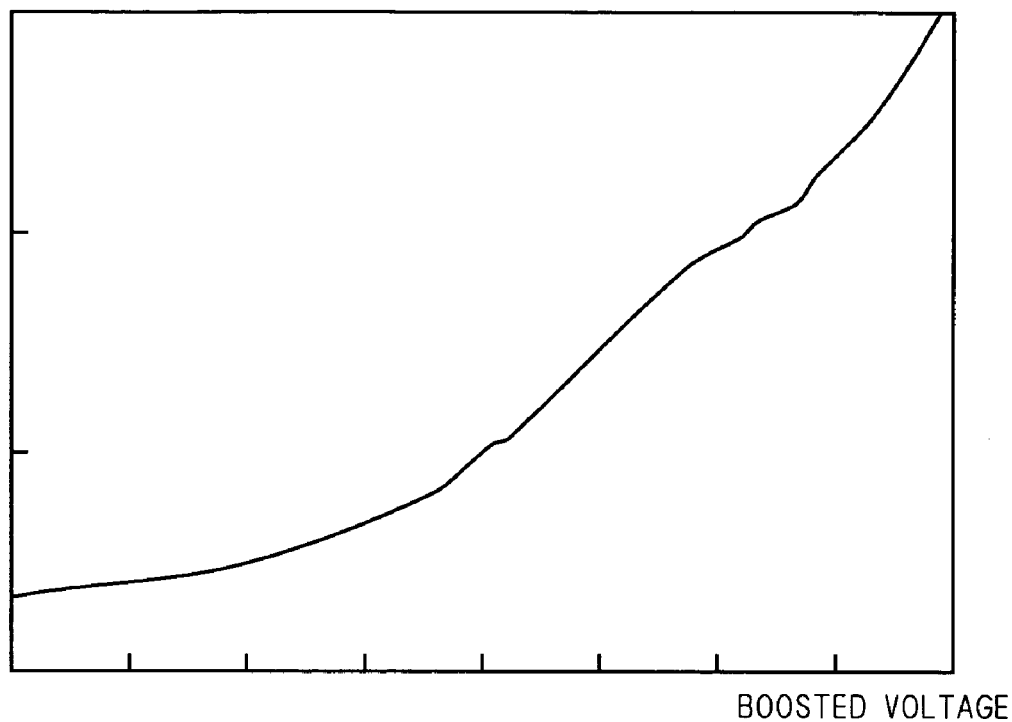
FIG. 13 shows an optimum gate resistance with respect to a boosted voltage in the fourth preferred embodiment.

FIG. 13 is a plot showing an optimum gate resistance (vertical axis) with respect to the level of a boosted voltage (horizontal axis). The plot of FIG. 13 is obtained by an exemplary way as follows. First, the gate resistance of the IGBT 41a is set to be relatively high to avoid breakage of the IGBT 41a as a result of a great magnitude of a surge voltage. Next, the motor controller 400 is driven at a boosted voltage of an appropriate level. Thereafter the resistance of the variable resistor 43 is gradually lowered while measuring the collector-emitter voltage VCE of the IGBT 41a, to find a gate resistance at which the collector-emitter voltage VCE is approximately the same in level as a breakdown voltage between the collector and the emitter. These steps are performed on several different levels of a boosted voltage, whereby the optimum gate resistance is obtained as data. The optimum gate resistance is eventually determined considering the factors into consideration including whether a surge voltage is within the allowable range, whether there is no possibility of thermal breakdown of an IGBT as a result of heat generation caused by switching loss, whether there is no possibility of increase of radiation noise as a result of a surge voltage, and the like.

On the basis of the received divided voltage, the second drive controller 403 obtains the level of a boosted voltage, reads an optimum gate resistance according to the data shown in FIG. 13, and outputs a control signal to the variable resistor 43 indicating the optimum gate resistance. In response to the received control signal, the variable resistor 43 is controlled to have the specified resistance. The remaining IGBTs in the inverter 404 also receive a control signal from the second drive controller 403 to be controlled in gate resistance.

In the motor controller 400 having the foregoing configuration, the variable resistors connected to the respective IGBTs constituting the inverter 404 are controlled in resistance in response to the boosted voltage. In the fourth preferred embodiment, a switching speed is constantly optimized in response to the boosted voltage, and hence, switching loss reduction is realized as compared with the configuration having a fixed switching speed relative to the maximum level of a boosted voltage.

Figure 15:
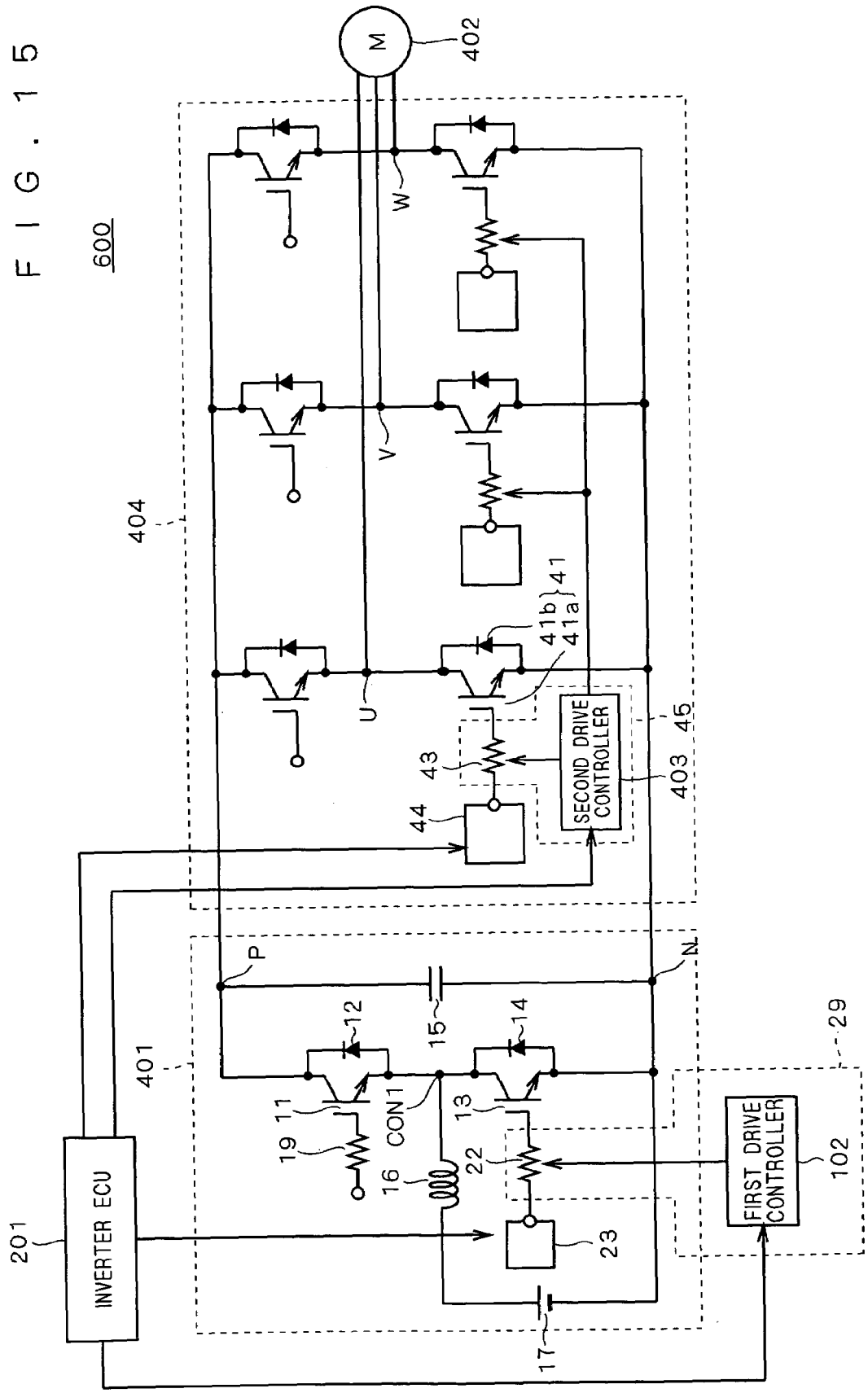
FIG. 15 is a circuit diagram showing the configuration of a motor controller according to a sixth preferred embodiment of the present invention.

The second drive controller 403 may alternatively receive a target boosted voltage sent from the inverter ECU 201, an example of which is shown in FIG. 15 to be discussed later. Such an alternative eliminates the voltage sensor 101, thereby realizing reduction in manufacturing cost and preventing breakage of the IGBTs caused by delay in the output of the voltage sensor 101.

Figure 16:
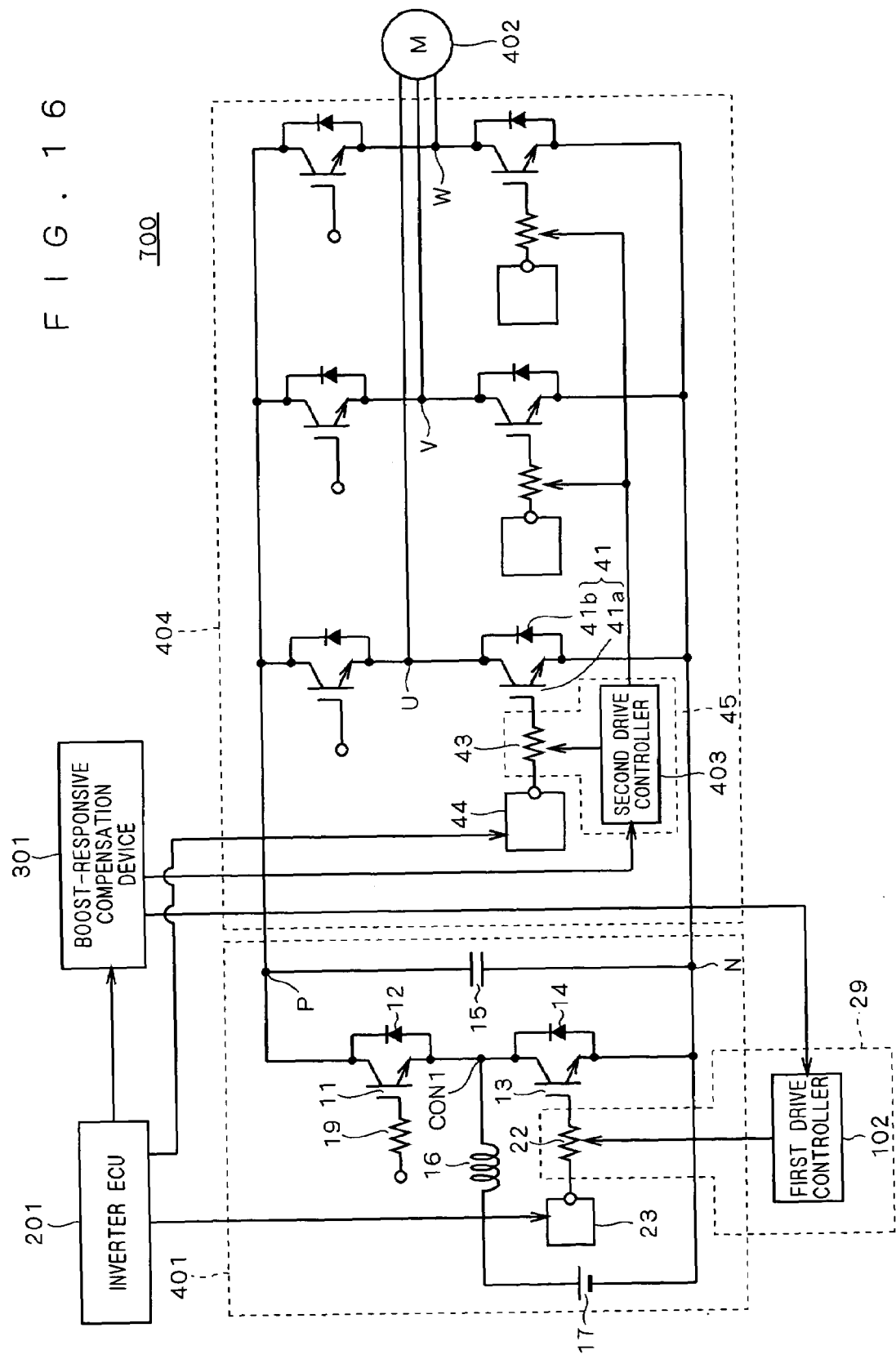
FIG. 16 is a circuit diagram showing the configuration of a motor controller according to a seventh preferred embodiment of the present invention.

The second drive controller 403 may still alternatively receive an estimated voltage sent from the boost-responsive compensation device 301, an example of which is shown in FIG. 16 to be discussed later. Such an alternative also eliminates the voltage sensor 101, thereby realizing reduction in manufacturing cost and preventing breakage of the IGBTs caused by delay in the output of the voltage sensor 101. Such an alternative further advantageously controls a switching speed on the basis of an estimated voltage approximately the same as an actual voltage, even in a time period after voltage boost is started to obtain a target boosted voltage, leading to still less switching loss.

Fifth Preferred Embodiment

Figure 14:
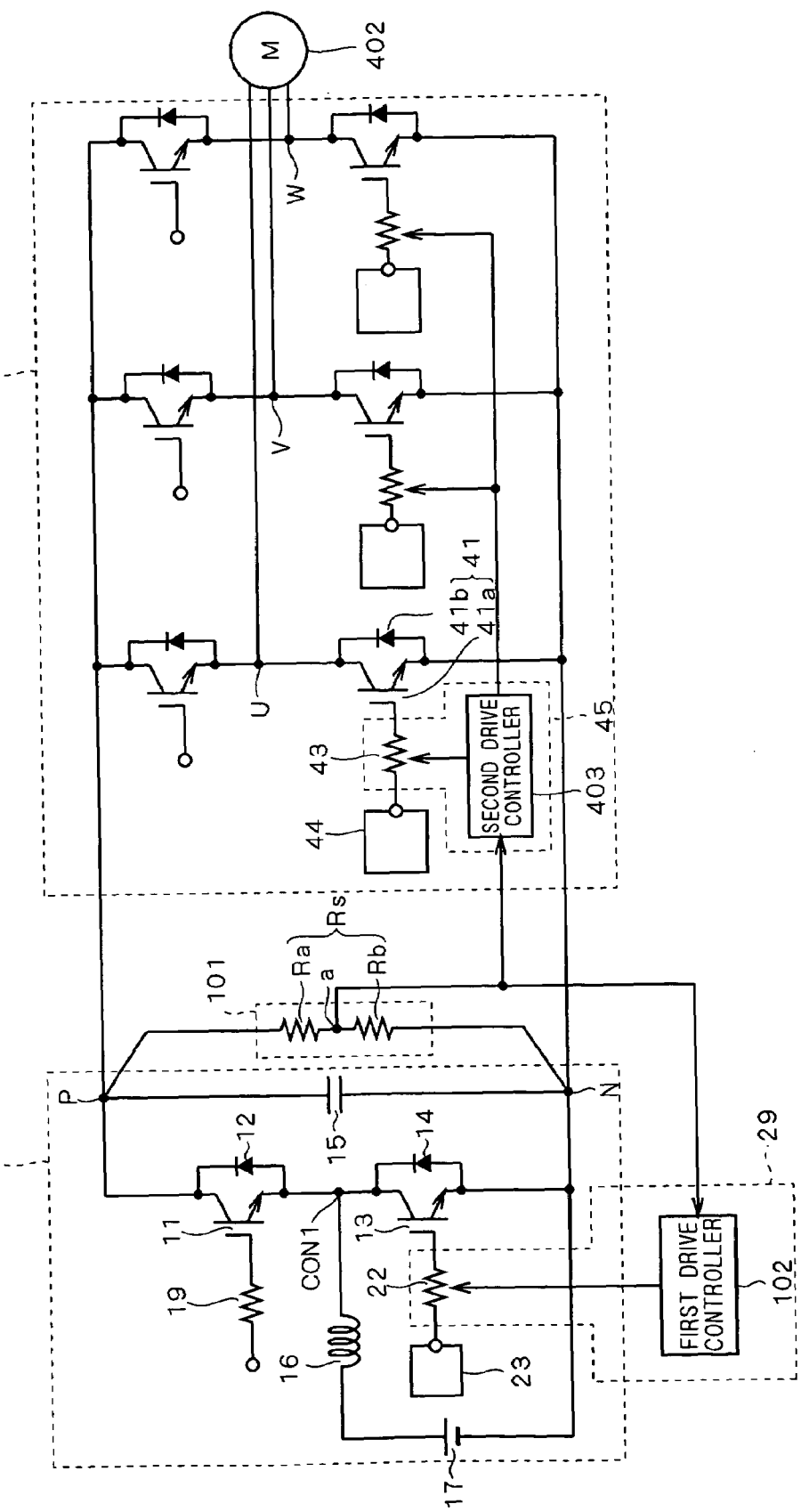
FIG. 14 is a circuit diagram showing the configuration of a motor controller according to a fifth preferred embodiment of the present invention.

FIG. 14 shows a motor controller 500 according to a fifth preferred embodiment of the present invention. The fifth preferred embodiment is a combination of the first and fourth preferred embodiments. The constituent elements serving in the same manner as those of the first or fourth preferred embodiment are designated by the same reference numerals, and the detailed description thereof will be omitted. The output terminals P and N receive a boosted voltage sent from the booster 401. The voltage sensor 101 for measuring the boosted voltage is connected to the output terminals P and N of the booster 401. A divided voltage obtained by the voltage sensor 101 is sent to the first and second drive controllers 102 and 403. The first and second drive controllers 102 and 403 both output a control signal to the variable resistor connected to each IGBT in the booster 401 and the inverter 404. The resistance of the variable resistor 22 is controlled in response to the control signal sent from the first drive controller 102. The resistance of the variable resistor 43 is controlled in response to the control signal sent from the second drive controller 403. The second drive controller 403 is also operative to control the resistances of the remaining variable resistors constituting the inverter 404.

Next, the operation of the motor controller 500 having the foregoing configuration will be discussed. The booster 401 drives the IGBT 13 to rise a power supply voltage to a desirable level. The inverter 404 drives the IGBT 41a to convert the boosted voltage into an alternating voltage. The voltage sensor 101 outputs a divided voltage to the first and second drive controllers 102 and 403. On receipt of the divided voltage, the first and second drive controllers 102 and 403 outputs a control signal indicating a gate resistance optimum for the boosted voltage. The fifth preferred embodiment follows the same process to obtain an optimum gate resistance as in the first and fourth preferred embodiments, and hence, the description thereof is omitted. In response to the input from the first drive controller 102, the variable resistor 22 in the booster 401 is controlled to be at an optimum gate resistance. In response to the input from the second drive controller 403, each variable resistor in the inverter 404 is controlled to be at an optimum gate resistance.

In the motor controller 500 having the foregoing configuration, the IGBT 13 in the booster 401 and the IGBTs in the inverter 404 are each allowed to be controlled to an optimum gate resistance, thereby realizing optimization in switching speed of the IGBTs in the booster 401 and in the inverter 404. That is, the IGBTs can be constantly controlled to an optimum switching speed. As a result, the motor controller 500 as a whole is allowed to have less switching loss than a configuration having a fixed switching speed relative to the maximum level of the boosted voltage.

Sixth Preferred Embodiment

FIG. 15 shows a motor controller 600 according to a sixth preferred embodiment of the present invention. The sixth preferred embodiment is a combination of the second and fourth preferred embodiments. The constituent elements serving in the same manner as those of the second or fourth preferred embodiment are designated by the same reference numerals, and the detailed description thereof will be omitted. The output terminals P and N receive a boosted voltage sent from the booster 401. A target boosted voltage is sent from the inverter ECU 201 to the first drive controller 102 and to the drive circuit 23 in the booster 401. This target boosted voltage is further sent to the second drive controller 403 and the drive circuit 44 in the inverter 404. The output of the first drive controller 102 is sent to the variable resistor 22. The output of the second drive controller 403 is sent to the variable connected to each IGBT constituting the inverter 404. The output of the inverter ECU 201 is still further sent to drive circuits connected to respective high-voltage IGBTs provided in the booster 401 and the inverter 404, which elements are omitted from FIG. 15 for simplification.

Next, the operation of the motor controller 600 according to the sixth preferred embodiment will be discussed. The drive circuit 23 in the booster 401 performs on-off control of the IGBT 13 on the basis of the target boosted voltage sent from the inverter ECU 201, whereby an actual voltage is boosted to the target value. The first drive controller 102 in the booster 401 reads a gate resistance optimum for the target boosted voltage (see FIG. 5), and outputs a control signal to the variable resistor 22 indicating the optimum gate resistance. The sixth preferred embodiment follows the same process to obtain the optimum gate resistance of the variable resistor 22 as in the first preferred embodiment, and hence, the description thereof is omitted. In response to the input from the first drive controller 102, the variable resistor 22 is controlled to be at the optimum gate resistance. The second drive controller 403 in the inverter 404 outputs a control signal to the variable resistors in the inverter 404 indicating a gate resistance optimum for the target boosted voltage. The sixth preferred embodiment follows the same process to obtain the optimum gate resistance of the variable resistors in the inverter 404 as in the fourth preferred embodiment, and hence, the description thereof is omitted. In response to the input from the second drive controller 403, the variable resistor 43 is controlled to be at the optimum gate resistance. The remaining IGBTs in the inverter 404 are also controlled to be at respective optimum gate resistances.

The motor controller 600 having the foregoing configuration also eliminates the voltage sensor 101, thus realizing reduction in manufacturing cost. The sixth preferred embodiment further advantageously controls the gate resistance of each IGBT to be at an optimum value on the basis of the target boosted voltage sent from the inverter ECU 201, which leads to control of the switching speed of each IGBT. As a result, the motor controller 600 as a whole is allowed to have a reduced switching speed. The sixth preferred embodiment prevents delay in the output of the voltage sensor 101, whereby breakage of the IGBTs is prevented that is caused by a surge voltage as a result of a switching speed higher than that determined by an actual voltage.

Seventh Preferred Embodiment

FIG. 16 shows a motor controller 700 according to a seventh preferred embodiment of the present invention. The seventh preferred embodiment is a combination of the third and fourth preferred embodiments. The constituent elements serving in the same manner as those of the third or fourth preferred embodiment are designated by the same reference numerals, and the detailed description thereof will be omitted. The output of the inverter ECU 201 is sent to the drive circuit 23 in the booster 401, and to the drive circuit 44 in the inverter 404. The output of the inverter ECU 201 is also sent to the boost-responsive compensation device 301. The output of the boost-responsive compensation device 301 is sent to the first drive controller 102 in the booster 401, and to the second drive controller 403 in the inverter 404. The output of the first drive controller 102 is sent to the variable resistor 22. The output of the second drive controller 403 is sent to the variable resistor 43. The output of the second drive controller 403 is also sent to the variable resistor connected to each IGBT constituting the inverter 404.

Next, the operation of the motor controller 700 having the foregoing configuration will be discussed. The inverter ECU 201 outputs a target boosted voltage to the drive circuit 23 and to the boost-responsive compensation device 301. The inverter ECU 201 also outputs a control signal to the drive circuit 44 in the inverter 404 that controls the frequency of an alternating voltage. On the basis of the received control signal, the drive circuit 44 performs on-off control of the IGBT 41*a*. On the basis of the received target boosted voltage, the drive circuit 23 performs on-off control of the IGBT 13 to start voltage boost. The boost-responsive compensation device 301 serves to estimate change in actual voltage over time by means of the target boosted voltage. The resultant estimated voltage is sent to the first drive controller 102 in the booster 401 and to the second drive controller 403 in the inverter 404.

The first drive controller 102 outputs a control signal to the variable resistor 22 indicating a gate resistance optimum for the estimated voltage. The seventh preferred embodiment follows the same process to obtain the optimum gate resistance of the variable resistor 22 as in the first preferred embodiment, and hence, the description thereof is omitted. In response to the input from the first drive controller 102, the variable resistor 22 is controlled to be at the optimum gate resistance. The second drive controller 403 in the inverter 404 outputs a control signal to the variable resistors in the inverter 404 indicating a gate resistance optimum for the estimated voltage. The seventh preferred embodiment follows the same process to obtain the optimum gate resistance of the variable resistors in the inverter 404 as in the fourth preferred embodiment, and hence, the description thereof is omitted. In repsonse to the input from the second drive controller 403, the variable resistor 43 is controlled to be at the optimum gate resistance. The variable resistor of each IGBT constituting the inverter 404 also receives the output of the second drive controller 403 to be controlled at the optimum gate resistance.

The motor controller 700 having the foregoing configuration also eliminates the voltage sensor 101, thus realizing reduction in manufacturing cost. The seventh preferred embodiment further prevents delay in the output of the voltage sensor 101, whereby a switching speed is prevented from being higher than that determined by an actual voltage. The seventh preferred embodiment also advantageously controls the gate resistances in the inverter 404 and the booster 401 in response to the estimated voltage obtained from the target boosted voltage. As a result, the motor controller 700 as a whole is allowed to have less switching loss than a device which drives an IGBT at a gate resistance obtained by the target boosted voltage.

While the invention has been shown and described in detail, the foregoing description is in all aspects illustrative and not restrictive. It is therefore understood that numerous modifications and variations can be devised without departing from the scope of the invention.

What is claimed is:

1. A booster for raising a power supply voltage to output a boosted voltage, said booster comprising:
   a voltage sensor configured to detect said boosted voltage; and
   a first driver configured to drive a gate of a first switching element,
   wherein said first driver includes a first switching speed controller configured to control an input current to said first switching element to control a switching speed of said first switching element in response to the output of said voltage sensor.

2. The booster according to claim 1,
   wherein said first switching speed controller includes a first variable resistor connected to said gate of said first switching element, and
   wherein said first variable resistor has a resistance which is controlled in response to said output of said voltage sensor.

3. A motor controller, comprising:
   a booster configured to raise a power supply voltage to output a boosted voltage by driving a first switching element, said booster comprising
   a voltage sensor configured to detect said boosted voltage, and
   a first driver configured to drive a gate of said first switching element,
   wherein said first driver includes a first switching speed controller configured to control an input current to said first switching element to control a switching speed of said first switching element in response to the output of said voltage sensor; and
   an inverter configured to convert said boosted voltage into an alternating voltage by driving a second switching element, said inverter comprising a second driver configured to drive a gate of said second switching element,
   wherein said second driver includes a second switching speed controller configured to control a switching speed of said second switching element in response to said output of said voltage sensor.

4. The motor controller according to claim 3,
   wherein said second switching speed controller includes a variable resistor connected to said gate of said second switching element, and
   wherein said variable resistor has a resistance which is controlled in response to said output of said voltage sensor.

5. A booster for raising a power supply voltage to output a boosted voltage, said booster comprising:
a high order system configured to output a target boosted voltage of a predetermined level; and
a first driver configured to drive a gate of said a first switching element,
wherein said first driver includes a first switching speed controller configured to control an input current to said first switching element to control a switching speed of said first switching element in response to the output of said high order system.

6. The booster according to claim 5,
wherein said first switching speed controller includes a first variable resistor connected to said gate of said first switching element, and
wherein said first variable resistor has a resistance which is controlled in response to said output of said high order system.

7. A motor controller, comprising:
a booster configured to raise a power supply voltage to output a boosted voltage by driving a first switching element, said booster comprising
a high order system configured to output a target boosted voltage of a predetermined level, and
a first driver configured to drive a gate of said first switching element,
wherein said first driver includes a first switching speed controller configured to control an input current to said first switching element to control a switching speed of said first switching element in response to the output of said high order system; and
an inverter configured to convert said boosted voltage into an alternating voltage by driving a second switching element, said inverter comprising a second driver configured to drive a gate of said second switching element,
wherein said second driver includes a second switching speed controller configured to control a switching speed of said second switching element in response to said output of said high order system.

8. The motor controller according to claim 7,
wherein said second switching speed controller includes a variable resistor connected to said gate of said second switching element, and
wherein said variable resistor has a resistance which is controlled in response to said output of said high order system.

9. A booster for raising a power supply voltage to output a boosted voltage, said booster comprising:
a high order system configured to output a target boosted voltage of a predetermined level;
a boost-responsive compensation device configured to estimate a change in said boosted voltage over time in response to the output of said high order system, and to output a resultant estimated voltage with respect to time; and
a first driver configured to drive a gate of a first switching element,
wherein said first driver includes a first switching speed controller configured to control an input current to said first switching element to control a switching speed of said first switching element in response to the output of said boost-responsive compensation device.

10. The booster according to claim 9,
wherein said first switching speed controller includes a first variable resistor connected to said gate of said first switching element, and
wherein said first variable resistor has a resistance which is controlled in response to said output of said boost-responsive compensation device.

11. A motor controller, comprising:
a booster configured to raise a power supply voltage to output a boosted voltage by driving a first switching element, said booster comprising
a high order system configured to output a target boosted voltage of a predetermined level,
a boost-responsive compensation device configured to estimate a change in said boosted voltage over time in response to the output of said high order system, and to output a resultant estimated voltage with respect to time, and
a first driver configured to drive a gate of said first switching element,
wherein said first driver includes a first switching speed controller configured to control an input current to said first switching element to control a switching speed of said first switching element in response to the output of said boost-responsive compensation device; and
an inverter configured to convert said boosted voltage into an alternating voltage by driving a second switching element, said inverter comprising a second driver configured to drive a gate of said second switching element,
wherein said second driver includes a second switching speed controller configured to control a switching speed of said second switching element in response to said output of said boost-responsive compensation device.

12. The motor controller according to claim 11,
wherein said second switching speed controller includes a variable resistor connected to said gate of said second switching element, and
wherein said variable resistor has a resistance which is controlled in response to said output of said boost-responsive compensation device.

13. A motor controller, comprising:
a booster configured to raise a power supply voltage to output a boosted voltage;
an inverter configured to convert said boosted voltage into an alternating voltage by driving a switching element; and
a voltage sensor configured to detect said boosted voltage,
said inverter comprising a driver configured to drive a gate of said switching element,
wherein said driver includes a switching speed controller configured to control an input current to said switching element to control a switching speed of said switching element in response to the output of said voltage sensor.

14. The motor controller according to claim 13,
wherein said switching speed controller includes a variable resistor connected to said gate of said switching element, and
wherein said variable resistor has a resistance which is controlled in response to said output of said voltage sensor.

15. A motor controller, comprising:
a booster configured to raise a power supply voltage to output a boosted voltage;
an inverter configured to convert said boosted voltage into an alternating voltage by driving a switching element; and
a high order system configured to output a target boosted voltage of a predetermined level, said inverter comprising a driver configured to drive a gate of said switching element, wherein said driver includes a switching speed controller configured to control an input current to said switching element to control a switching speed of said switching element in response to the output of said high order system.

16. The motor controller according to claim 15, wherein said switching speed controller includes a variable resistor connected to said gate of said switching element, and wherein said variable resistor has a resistance which is controlled in response to said output of said high order system.

17. A motor controller, comprising:

a booster configured to raise a power supply voltage to output a boosted voltage;

an inverter configured to convert said boosted voltage into an alternating voltage by driving a switching element;

a high order system configured to output a target boosted voltage of a predetermined level; and a boost-responsive compensation device configured to estimate a change in said boosted voltage over time in response to the output of said high order system, and to output a resultant estimated voltage with respect to time, said inverter comprising a driver configured to drive a gate of said switching element, wherein said driver includes a switching speed controller configured to control an input current to said switching element to control a switching speed of said switching element in response to the output of said boost-responsive compensation device.

18. The motor controller according to claim 17, wherein said switching speed controller includes a variable resistor connected to said gate of said switching element, and wherein said variable resistor has a resistance which is controlled in response to said output of said boost-responsive compensation device.

* * * * *